United States Patent [19]
Pichl

[11] Patent Number: 5,172,461
[45] Date of Patent: Dec. 22, 1992

[54] METHOD OF PRODUCING ELECTRICAL RESONANT CIRCUITS, SPECIFICALLY RESONANCE LABELS

[76] Inventor: Fritz Pichl, Seehaldenstrasse 17, CH 8802 Kilchberg, Switzerland

[21] Appl. No.: 743,761

[22] Filed: Aug. 12, 1991

[30] Foreign Application Priority Data

Aug. 17, 1990 [CH] Switzerland ............................ 2-2685

[51] Int. Cl.$^5$ .......................... H01G 4/26; H01F 41/04
[52] U.S. Cl. ...................................... 29/25.42; 29/847; 29/850; 336/200; 340/572; 427/79
[58] Field of Search ...................... 29/25.42, 846, 847, 29/850, 602.1; 336/200; 340/572; 361/402; 427/79, 81

[56] References Cited

U.S. PATENT DOCUMENTS

| | | | |
|---|---|---|---|
| 3,864,824 | 2/1975 | Watson et al. | 29/593 X |
| 3,913,219 | 10/1975 | Lichtblau | 29/592.1 |
| 4,369,557 | 1/1983 | Vandebult | 29/25.42 |
| 4,797,785 | 1/1989 | Jorgensen | 29/25.42 X |
| 4,930,044 | 5/1990 | Eda et al. | 29/25.42 X |
| 4,965,698 | 10/1990 | Thoma et al. | 29/25.42 X |

*Primary Examiner*—Timothy V. Eley
*Attorney, Agent, or Firm*—Laurence R. Brown

[57] ABSTRACT

By means of this invention electrical resonant circuits, specifically resonance labels having a capacitor and a coil on a dielectric are produced for reliable deactivation by means of an electrical discharge between the capacitor surfaces. Heretofore aluminum threads produced from the material of the capacitor surfaces is not supported in place so that it can break with handling and vibration and cause reactivated of the resonant circuit leading to a false alarm in the safety system. According to this method a plurality of conductive bodies of a size in the micron range, e.g. copper dust is introduced in the dielectric so that a spark from discharge of a capacitor will cause an electrically conducting connection between the capacitor surfaces, which is embedded in a thread like shape in the dielectric. By using copper dust, an alloy is formed with the aluminum which evaporates during the spark discharge such that the thread produced has a substantially larger ductility than pure aluminum.

9 Claims, 1 Drawing Sheet

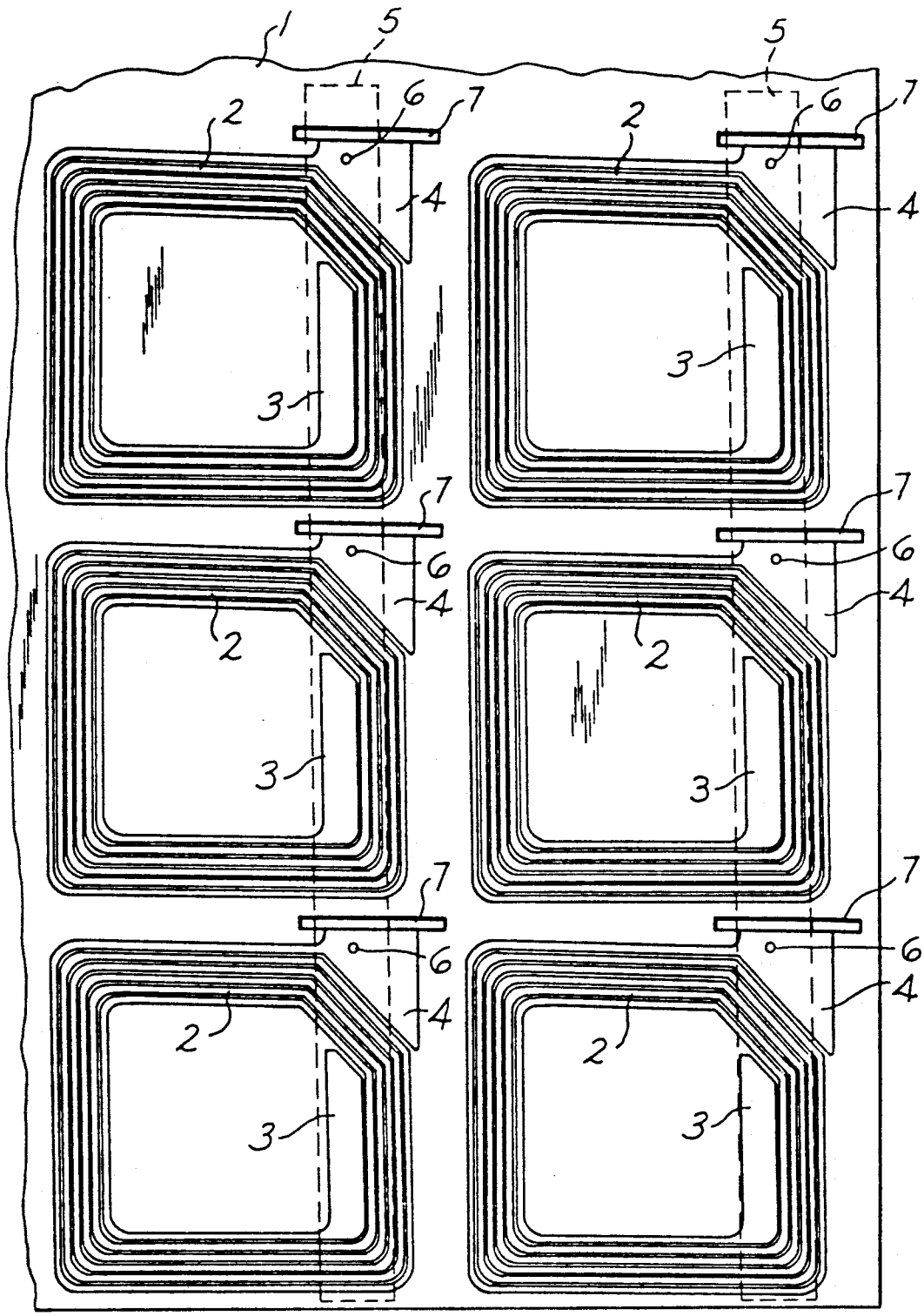

METHOD OF PRODUCING ELECTRICAL RESONANT CIRCUITS, SPECIFICALLY RESONANCE LABELS

BACKGROUND OF THE INVENTION

1. Field of the Invention

The present invention relates to a method of producing electrical resonant circuits, specifically resonance labels, for use in a theft protection system in which a coil and a capacitor located on a dielectric form a respective resonant circuit, where the coil having the shape of a spiral and one surface of the capacitor are located at the one side and the second surface of the capacitor is located at the other side of the dielectric.

2. Description of the Prior Art

Electrical resonant circuits of this kind placed onto a supporting foil and thereafter treated further in order to be used as adhesive labels or hard shells of a plastic material in a theft protection system have until now been produced predominantly by means of an etching method. Thus two aluminum foils are separated from each other by a non-conductive layer such as a plastic material, in which by means of printing of an etching medium resistant lacquer onto the two aluminum foils the desired shape of the resonant circuit consisting of a coil and a capacitor is formed. When the undesired parts of the aluminum foil are removed by the etching procedure a coil in shape of a planar spiral and a first capacitor surface remain on the one side of the supporting foil and a second capacitor surface is produced by the etching procedure on the other side of the supporting foil, which surface still is to be electrically connected to the first one.

When using a resonance label equipped with such a resonant circuit in a theft protection system the resonant circuit is deactivated or switched off upon paying for the wares equipped with such a label at the cash register which proceeds by a spark discharge or burn out of the capacitor. If the ware has not been paid for, a current flow is induced in the resonance circuit when passing through an electromagnetic field at the exit of the store which triggers an alarm.

In order to make the burn out of the capacitor for the deactivating possible, it previously had been the practice to thin out the dielectric between the two capacitor surfaces at a certain area whereby a thinning of the dielectric down to 1-3 microns is necessary, because otherwise no electric discharge between the two surfaces of the capacitor can be achieved because the level of the current which may be used is limited by regulations. Due to measurements which have been made it is known that for a thickness of 25 microns of a dielectric consisting for instance of polyethylene, about 500 Volts are needed. In case of a thickness of 1-3 microns achieved by a thinner dielectric, 5-10 Volts are still necessary for the discharge. The thickness of the dielectric of 1-3 micron must be carefully maintained because otherwise in dimension contacting of the aluminum surfaces of the capacitor can occur such that the resonance circuit is shorted out prior to its use. Also, in case of an extremely thin layer, the magnetic field in the detection system may deactivate the resonance label. If, at the other hand, the thickness of the dielectric is too high, the current level generated by the deactivating station at the cash register cannot produce the burn out of the capacitor, such that a deactivating is not possible.

Upon the electrical discharge a fine thread of deposited aluminum vapor is produced which is quite brittle. If the thinning of the dielectric matter by means of tools and by an application of pressure and/or temperature has not been made extremely carefully, it is possible that cracks or grooves develop in the dielectric at the thinned area or the material of the dielectric is partly displaced. In such case the thread of aluminum produced during the deactivation remains no longer embedded and supported in the material of the dielectric and rather hangs exposed in a free space between the two aluminum surfaces and will easily break with slight vibration and bending such that the resonance label is reactivated. The result of this is that the client, although he has paid for his purchase at the cash register triggers an alarm when passing the safety system at the exit of the store and is stopped erroneously which leads to considerable inconvenience.

SUMMARY OF THE INVENTION

Hence, it is a general object of the present invention to completely eliminate errors of this kind in such a safety system with electrical resonant circuits or resonance labels, and to safely guarantee that the aluminum thread produced upon the deactivation by means of the electrical discharge is supported by and embedded in the dielectric.

A further object is to produce resonant circuits, specifically resonance labels for use in a theft protection system, which is later deactivated by means of a spark discharge obtained by discharging of a capacitor, in which labels a plurality of bodies of a size in the micron range are introduced into the dielectric. These bodies are adapted in response to the spark discharge to cause an electrically conductive connection between the surfaces of a thread-like shape embedded substantially in the dielectric.

BRIEF DESCRIPTION OF THE DRAWING

The invention will be better understood and objects other than those set forth above, will become apparent when consideration is given to the following detailed description. Such description makes reference to the annexed drawing, wherein the single figure illustrates how resonance labels are produced.

DESCRIPTION OF THE PREFERRED EMBODIMENTS

A supporting foil 1 is a dielectric of a plastic material such as for instance polypropylene or polystyrene or polyethylene. On one side of this supporting foil 1, or as illustrated, a plurality of planar spirals 2 and capacitor surfaces 3 next to each other are produced by a generally known etching technique. A suitable procedure is to proceed from an aluminum foil coextruded on one side of a plastic supporting foil, and printing the aluminum foil with a lacquer which is resistant against etching mediums. After the lacquer is dry the unprinted portion of the aluminum foils is etched off. In addition to the capacitor surface 3 at the inner end of the spiral 2 a small supplementary surface 4 is produced by etching at the outer end of the spiral 2 for electrical connection to the second capacitor surface to be later applied onto the other side of the supporting foil.

Before the supporting foil 1 receives the second capacitor surface, the supporting foil 1 is given a specific treatment in accordance with the present invention. The supporting foil 1 has a thickness of about 20-30 $\mu$, which would necessitate an unacceptable high voltage for an electrical discharge. About 5-10 Volts can be induced in the deactivating stations such that an electrical discharge is possible only in a supporting foil of no greater than about 2.5 microns thickness. Thus, and in accordance with the invention a plurality of bodies of a size in the micron range is introduced into the dielectric formed by the supporting foil 1, which bodies upon the spark like discharge of the capacitor will let an electrically conductive connection form itself between the capacitor surfaces, which then is embedded at least substantially in the dielectric in shape of a thread. It is, thereto, possible to select either electrically conducting bodies such as coal, soot or a metal powder or bodies which will become electrically conducting under the action of the spark like discharge, such as for instance oxides. As long as the distance between these bodies in the dielectric amounts to only a few μ, deactivating takes place. It is, furthermore, also possible to introduce a mixture of bodies of different chemical structures into the dielectric such that a spark discharge triggers a reaction. For instance copper dust may be introduced into the dielectric such that upon the spark discharge the copper and the evaporated aluminum form an alloy. The thread which is produced in this case is much more flexible and ductile than the brittle thread of aluminum.

In order to introduce these bodies of a micron range size, a zone in the supporting foil 1 is selected which has a position superimposed upon the capacitor surface 3. The introducing of these bodies proceeds by application of pressure and temperature or the bodies are blown under pressure onto the dielectric and then rolled thereinto. Any of these procedures has as object the achieving of an as even as possible distribution of these bodies in the dielectric, whereby the distance between the bodies should not be less than 3 μ. A number of these bodies can contact each other directly, but no conductive chain extending from one surface of the capacitor to the other one should be produced. When the bodies are rolled in and when temperature is applied the viscous dielectric flows around the bodies to mix well. In all embodiments of the method it is important that the thread which is produced at the later deactivation is firmly embedded in the dielectric.

A further method of introducing bodies of a size in the micron range into the dielectric is to pass the supporting foil 1, on which in accordance with the drawing a plurality of coils 2 and capacitor surfaces 3 have been produced, between two electrodes and to generate when the electrodes are positioned exactly over the capacitor surface 3 one or a plurality of discharges. Preferably an electrode consisting of copper is used because the copper particles from together with the aluminum particles in the spark plasma an alloy. The discharge proceeds form the electrode at the side of the capacitor through the aluminum of the capacitor and through the supporting foil consisting of the plastic material to the other electrode. With this procedure at least one or a plurality of electrically conducting threads in the dielectric matter is produced.

The producing of the second capacitor surface on the other side of the foil proceeds preferably according to a new method without etching. Thus a continuous aluminum strip 5 is sealed onto a supporting foil 1 having in accordance with the drawing a plurality of spirals 2 and capacitor surfaces 3 located in succession one after the other onto the other side of the supporting foil 1 and in a superimposed position relative to the first capacitor surface 3 and a few of the tracks of the conduit of the spiral 2. Thereafter, an electrically conductive connection is made between the supplementary surface 4 and the aluminum web 5 by crimping at 6 and severing of the continuous aluminum web 5 by means of punching cuts 7 thereby to produce the individual single resonant circuits.

When the continuous aluminum strip 5 is sealed onto the supporting foil 1 a liquefying of the plastic material of the supporting foil occurs whereby a part of this material flows towards the edge of the capacitor. Due to this the previously produced conductive threads are broken up in the flow of the plastic material and become dislocated relative to each other, specifically by a distance of 2-3 micron. Accordingly, conductive parts of one or more threads are formed, the ends of which having a distance from each other amounting to a few microns, whereby the plastic material of the supporting foil which liquefied during the sealing process encloses the parts of the threads tightly and compactly. Now in deactivation of the resonant circuit, the spark jumps from the surface of the capacitor along the parts of the previously produced threads to the other capacitor surface. The spark tears aluminum particles out of the capacitor surface which unite themselves with the conductive particles in the spark plasma and thus form a ductile thread which is firmly enclosed in the plastic material of the dielectric. This excludes a thread which interconnects the two aluminum surfaces in an electrically conductive manner from being located in a free space such that it could rupture easily which would lead to renewed activation of the resonant circuit.

Introducing of electrically conducting particles into the dielectric can be made, however, also after the second capacitor surface has been placed onto the supporting foil, i.e. the above disclosed method can also be applied to conventional production of resonant circuits by etching. Thus, not only the spark discharge but also a laser beam can be used for the introducing of electrically conducting particles into the dielectric. It is for instance possible, according to a modification of the method to apply a layer of an arbitrary material onto the capacitor surface and to introduce that material through the aluminum foil into the plastic material, and specifically by means of a spark discharge or a laser beam. This is then followed, if necessary, with application of pressure and temperature in order to embed parts of the thread in the material of the dielectric.

While there are shown and described present preferred embodiments of the invention, it is to be distinctly understood that the invention is not limited thereto, but may be otherwise variously embodied and practiced within the scope of the following claims.

I claim:

1. A method of producing improved electrical resonance labels for use in a theft protection system with a coil having the shape of a spiral and one surface of the capacitor located on one side and the second surface of the capacitor located on the other side of the dielectric, adapted for later deactivation of the resonant circuit by means of a spark discharge, comprising the steps of:
introducing a plurality of bodies of a size in the micron range in the dielectric to cause by the spark discharge an electrically conductive connection between the capacitor surfaces of a thread-like shape substantially embedded in the dielectric.

2. The method of claim 1, wherein the introducing step further comprises introducing a plurality of electrically conductive bodies of a size in the micron range into the dielectric.

3. The method of claim 2, wherein the introducing step further comprises introducing a mixture of bodies of various chemical structures into the dielectric, and further comprising the steps of triggering a chemical reaction involving the chemical structures by the spark discharge.

4. The method of claim 2, wherein the capacitor surfaces are aluminum and the introducing step further comprises introducing copper dust into the dielectric, and further comprising the step of triggering a discharge to produce an alloy with evaporated aluminum of the capacitor surfaces having a ductility exceeding the ductility of pure aluminum.

5. The method of claim 1, wherein the bodies are rolled into the dielectric by application of pressure and temperature.

6. The method of claim 1, wherein the dielectric comprises a supporting foil having on one side a coil and a capacitor surface produced from an aluminum foil whereby the introducing step further comprises moving the computer surface between two copper electrodes, and inducing electrical discharges between the copper electrodes to produce at least one electrical conductor in the supporting foil consisting of an alloy of evaporated aluminum and copper particles.

7. The method of claim 1, wherein the introduction step further comprises depositing bodies of a layer of material on the surface of a capacitor located on the dielectric having a size in the micron range, introducing the bodies into the dielectric by means of electromagnetic discharge to form a thread shaped conductor in the dielectric material.

8. The method of claim 1 wherein the introducing step further comprises introducing bodies of a size in the micron range into the dielectric of a material that is rendered conductive in the presence of an electric spark discharge, and discharging an electric spark from a capacitor through the dielectric to render the bodies electrically conductive.

9. The method of claim 1 further comprising the step of sealing an aluminum strip to said other side of the dielectric after introducing the bodies into the dielectric.

* * * * *